United States Patent
Wu et al.

(10) Patent No.: US 12,007,691 B2
(45) Date of Patent: *Jun. 11, 2024

(54) SUBSTRATE MEASURING DEVICE AND A METHOD OF USING THE SAME

(71) Applicant: Taiwan Semiconductor Manufacturing Co., Ltd., Hsinchu (TW)

(72) Inventors: Min-Cheng Wu, Hsinchu (TW); Chi-Hung Liao, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/855,591

(22) Filed: Jun. 30, 2022

(65) Prior Publication Data

US 2022/0334490 A1    Oct. 20, 2022

Related U.S. Application Data

(60) Continuation of application No. 17/374,753, filed on Jul. 13, 2021, now Pat. No. 11,409,201, which is a
(Continued)

(51) Int. Cl.
*G03F 7/20*  (2006.01)
*G03F 1/42*  (2012.01)
(Continued)

(52) U.S. Cl.
CPC .............. *G03F 7/2022* (2013.01); *G03F 1/42* (2013.01); *G03F 7/2004* (2013.01);
(Continued)

(58) Field of Classification Search
CPC ........ G03F 7/2022; G03F 1/42; G03F 7/2004; G03F 7/70625; G03F 7/7085;
(Continued)

(56) References Cited

U.S. PATENT DOCUMENTS 7,460,237 B1 * 12/2008 Cramer ............. G03F 7/706837
356/243.1
11,092,892 B2    8/2021  Wu et al.
(Continued)

*Primary Examiner* — Hung V Nguyen
(74) *Attorney, Agent, or Firm* — Seed IP Law Group LLP

(57) ABSTRACT

Embodiments of the present disclosure provide a substrate measuring device in a lithography projection apparatus that provides multiple light sources having different wavelengths. In some embodiments, a lithography projection apparatus includes a substrate measuring system disposed proximate to a substrate stage, the substrate measuring system further including an emitter including multiple light sources configured to provide multiple beams of light, each of at least some of the multiple beams of light having a different wavelength, at least one optical fiber, wherein each of respective portions of the at least one optical fiber is configured to pass a respective one of the multiple beams of light, and a receiver positioned to collected light emitted from the emitter and reflected off of a substrate disposed on the substrate stage.

20 Claims, 8 Drawing Sheets

Related U.S. Application Data division of application No. 16/049,678, filed on Jul. 30, 2018, now Pat. No. 11,092,892.

(51) Int. Cl.
*G03F 7/00* (2006.01)
*G03F 9/00* (2006.01)

(52) U.S. Cl.
CPC ........ *G03F 7/70625* (2013.01); *G03F 7/7085* (2013.01); *G03F 9/7065* (2013.01)

(58) Field of Classification Search
CPC .. G03F 9/7065; G03F 9/7003; G03F 7/70608; G03F 9/7088
See application file for complete search history.

(56) References Cited

U.S. PATENT DOCUMENTS

| | | |
|---|---|---|
| 11,409,201 B2 * | 8/2022 | Wu ................... G03F 9/7003 |
| 2013/0141730 A1 | 6/2013 | Quintanilha |
| 2017/0184981 A1 | 6/2017 | Quintanilha et al. |
| 2017/0277046 A1 | 9/2017 | Leung et al. |
| 2018/0073864 A1 | 3/2018 | Watanabe |

* cited by examiner

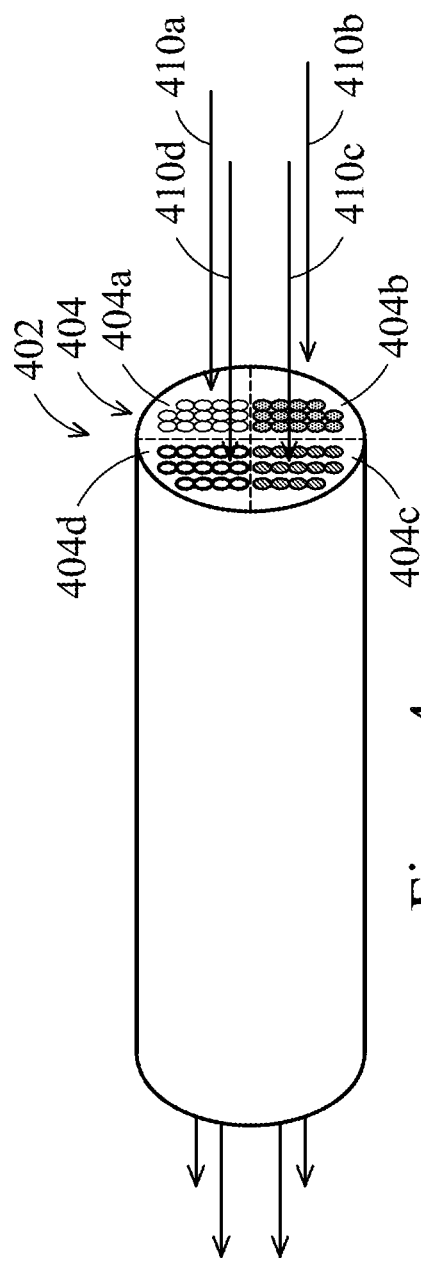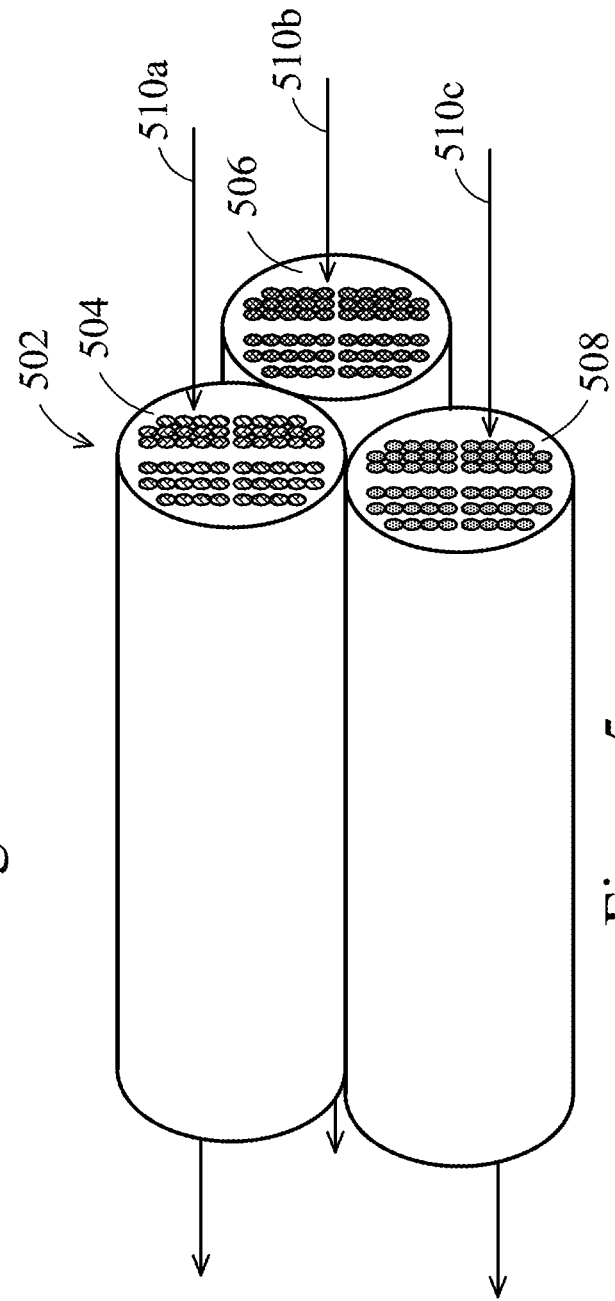
Figure 4
Figure 5

SUBSTRATE MEASURING DEVICE AND A METHOD OF USING THE SAME

RELATED APPLICATION

This application is a Continuation application of U.S. Divisional patent application Ser. No. 17/374,753 filed Jul. 13, 2021, which claims priority to U.S. application Ser. No. 16/049,678 filed Jul. 30, 2018, now U.S. Pat. No. 11,092,892, Issued on Aug. 17, 2021.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs.

Photolithography has been used to form components on a chip. As the dimensions of the integrated circuit components are reduced, the lithography process is required to transfer even smaller features onto a substrate precisely, accurately, and without damage. The desire of the high resolution lithography process has led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 depicts an optical fiber in accordance with some embodiments.

FIG. 5 depicts a plurality of optical fibers in accordance with some embodiments.

DETAILED DESCRIPTION

Figure 1:
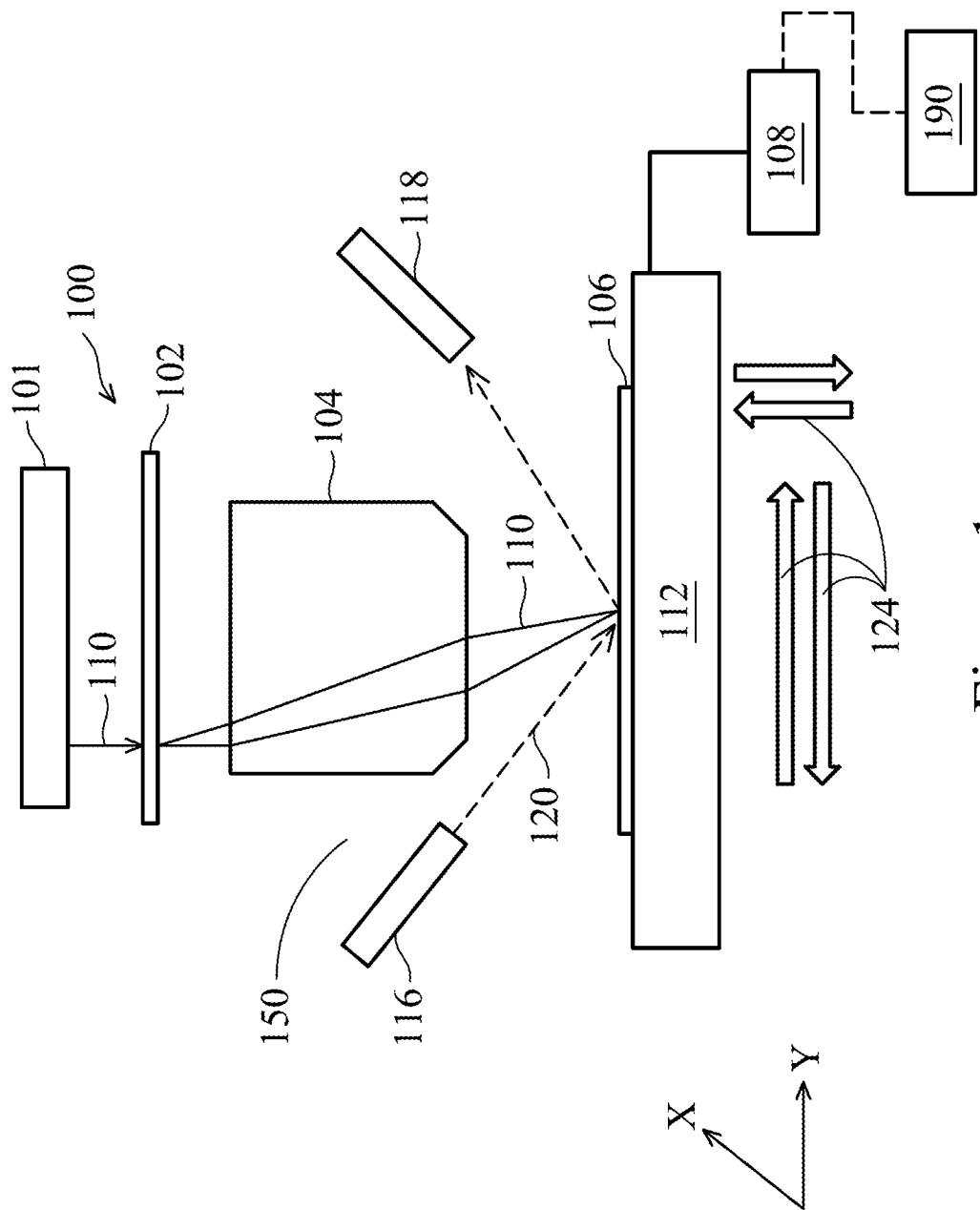
FIG. 1 depicts a schematic view of an example lithography projection apparatus including a substrate measuring device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the present disclosure provides example embodiments relating to a substrate measuring device used in a lithography projection apparatus. The substrate measuring device includes an emitter that provides multiple light sources having different wavelengths. The substrate measuring device further includes a receiver that detects responses to the light having different wavelengths reflected from a substrate. The light (having different wavelengths) reflected from the substrate is used to determine variations of height and/or a profile of a substrate surface. Thus, a better prediction of the substrate profile can be obtained so as to determine a vertical position of the substrate relative to a focal plane for the subsequent lithography exposure process with improved resolution. The beams of light from the multiple light sources are guided by an optical fiber or a plurality of optical fibers formed in the emitter. The beams of light guided from the optical fiber(s) are then emitted to desired locations of the substrate so the receiver can detect reflected light, which can be used to determine a substrate profile. The determined substrate profile can assist alignment of the substrate for the subsequent lithography exposure process. The optical fiber may have multiple zones fabricated from the same or different materials to guide each individual light source with a certain wavelength. Additionally or alternatively, the plurality of optical fibers in the emitter may have different optical fibers guiding different beams of light of different wavelengths.

FIG. 1 depicts a lithography projection apparatus 100 that may be used to provide beam energy to a photoresist material disposed on a substrate during a lithography exposure process. In some embodiments, the lithography projection apparatus 100 comprises a radiation source 101 disposed above a photomask reticle 102. The radiation source 101 may provide a beam of radiation 110 with a desired wavelength. In some examples, the radiation source 101 provides and emits the beam of radiation 110 at a wavelength in a range from about 10 nm to about 2000 nm, such as about 13.5 nm, 135 nm, 157 nm, 193 nm, 248 nm, or 365 nm. The beam of radiation 110 passes through the photomask reticle 102 to an optical focusing module 104. The optical focusing module 104 transforms the beam of radiation 110 emitted by the radiation source 101 using at least one lens (not shown) in the optical focusing module 104 into a line, spot, or other suitable beam configuration to be further directed at a photoresist material disposed on a semiconductor substrate 106 disposed on a stage 112. The lens in the optical focusing module 104 includes any suitable lens, or series of lenses, capable of focusing radiation into a line or spot. In some embodiments, the optical focusing module 104 includes a cylindrical lens. In some embodiments, the optical focusing module 104 includes one or more concave lenses, convex lenses, plane mirrors, concave mirrors, convex mirrors, refractive lenses, diffractive lenses, Fresnel lenses, gradient index lenses, or the like.

The beam of radiation 110 is selectively applied to certain areas of the substrate 106 to provide radiation energy to discrete predetermined regions of the substrate 106. The stage 112 is configured to support the substrate 106, and a translation mechanism 124 is configured to control vertical and lateral movement of the stage 112.

A substrate measuring device 150 is disposed proximate to the substrate 106. The substrate measuring device 150 includes an emitter 116 and a receiver 118. The emitter 116 is disposed above the stage 112. The emitter 116 provides beams of light 120 (e.g., a signal) with different wavelengths emitted to the surface of the substrate 106. The beams of light 120 are then reflected from the substrate 106 and are collected by the receiver 118. The receiver 118 generates data or information based on the light 120 collected by the receiver 118. For example, the data or information can be digital data corresponding to intensity and/or location of the light 120 that is collected by the receiver 118. As examples, the receiver 118 can be an image sensor (e.g., a CMOS image sensor), a charged coupled device (CCD), or the like. The receiver 118 may include one or more light filters for distinguishing between different wavelengths of light. The data or information generated by the receiver 118 based on the collected light 120 is transmitted to a controller 108 and to a data computing system 190. The data computing system 190 analyzes the data or information to obtain information regarding the surface topography and profile of the semiconductor substrate 106 positioned on the stage 112 and to determine an upper most surface of the substrate 106.

The substrate measuring device 150 (with the emitter 116 that provides a light source with different wavelengths and a corresponding receiver 118 capable of collecting light of different wavelengths) may be used to determine various properties or characteristics of, for example, films on the semiconductor substrate 106. For example, data or information generated by the receiver 118 can be analyzed to determine different responses by the films to having light with different wavelengths incident thereon. Accordingly, the substrate measuring device 150 is configured to distinguish between responses to light at different wavelengths. For example, the emitter 116 can serially emit light with a single wavelength or narrow wavelength spectrum (with each serial emission being at a different wavelength), and hence, the receiver 118 can serially collect light at different wavelengths for analyzing the responses of the films to the light at those wavelengths. In other examples, the emitter 116 can emit light with multiple wavelengths simultaneously or in parallel, and the receiver 118 can have a configuration of filters to attenuate or exclude light outside of a wavelength band of the respective filter so the receiver 118 can isolate a response to a given wavelength. With data or information generated by the receiver 118 corresponding to a given wavelength or narrow wavelength spectrum, the data or information may be used to detect different film properties or characteristics, such as local thickness, stress, refractive index and extinction coefficient (n & k), surface roughness, variation of height, surface profile, surface topography, or resistivity on the substrate 106 prior to performing a lithography exposure process.

The data generated by the data computing system 190 in response to data generated by the substrate measuring device 150 may also help to identify the coordinate, alignment, or orientation of the substrate 106 so as to enhance the alignment of the substrate 106 for the following lithography exposure process. The emitter 116 and the receiver 118 may be coupled to a controller 108, so as to control movement of the stage 112 and data transfer from the receiver 118.

The controller 108 may be a high speed computer that communicates with the data computing system 190. The data points generated by the substrate measuring device 150 are transmitted to the controller 108 and then to the data computing system 190 to determine a profile/structure of substrate 106. With the profile/structure of the substrate 106 determined, a proper location or leveling position for the substrate 106 may be determined to perform alignment for the lithography process. For example, with the profile/structure of the substrate 106, the controller 108 can determine at what location (e.g., including vertically) to optimally position the substrate 106 within or near a focal plane of the lithography process. After the alignment process, the substrate 106 is then ready for a lithography exposure process performed in the lithography projection apparatus 100.

In some embodiments, the translation mechanism 124 may be configured to translate the stage 112 vertically and/or laterally. The translation mechanism 124 may be configured to move the stage 112 in different directions. In some embodiments, the translation mechanism 124 is coupled to the stage 112 and is adapted to move the stage 112 relative to the emitter 116 and/or the receiver 118 and relative to the optical focusing module 104. In another embodiment, the translation mechanism 124 may also control the movement of the radiation source 101 and/or the optical focusing module 104 to cause a focal plane of the beam of radiation 110 to move relative to the substrate 106 that is disposed on the stage 112. Any suitable translation mechanism 124 may be used, such as a conveyor system, rack and pinion system, an x/y actuator, a robot, or other suitable mechanical or electro-mechanical mechanism. Additionally and/or alternatively, the stage 112 may be configured to be stationary, while a plurality of galvanometric heads (not shown) may be disposed around the substrate edge to direct radiation from the beam of radiation 110 to the substrate 106.

The translation mechanism 124 may be coupled to the controller 108 to control the speed at which the stage 112 moves relative to the emitter 116, the receiver 118, the radiation source 101, and/or the optical focusing module 104. The controller 108 may receive data from the receiver 118 or from the data computing system 190 to generate an optimized focal plane that is used to control the lithography projection apparatus 100.

The substrate measuring device 150 is used to determine the height, slope, surface topography, profile, upper most surface, and/or general structure of the substrate 106. The stage 112 is raised or lowered based on the determined profile/structure of the substrate 106 so as to ensure that the uppermost surface of the substrate 106 is located in or close to the focal plane defined from the optical focusing module 104. The substrate measuring device 150 assists determining a location where the substrate 106 with different profiles/structures of the material layers formed on the substrate 106 may be located during the lithography exposure process, thus promoting the accuracy and resolution for the following lithography exposure process. One factor that can influence the imaging quality of the lithography projection apparatus 100 is the accuracy with which the image from the photomask reticle 102 is focused on the substrate 106. However, the scope for adjusting the position of the focal plane of the optical focusing module 104 can be limited, and the depth of focus of the lithography projection apparatus 100 may also be small, thus rendering a relatively tight process window for the exposure area of the substrate 106. The presence of the structures from the previous process steps may also affect the height of the substrate and the flatness of the substrate surface. Thus, precise measurement or determination of the focal plane relative to the upper most surface of the substrate 106 can affect the resolution and the accuracy of the image transfer from the photomask reticle 102 to the photoresist material disposed on the substrate in the lithography exposure process.

Figure 2:
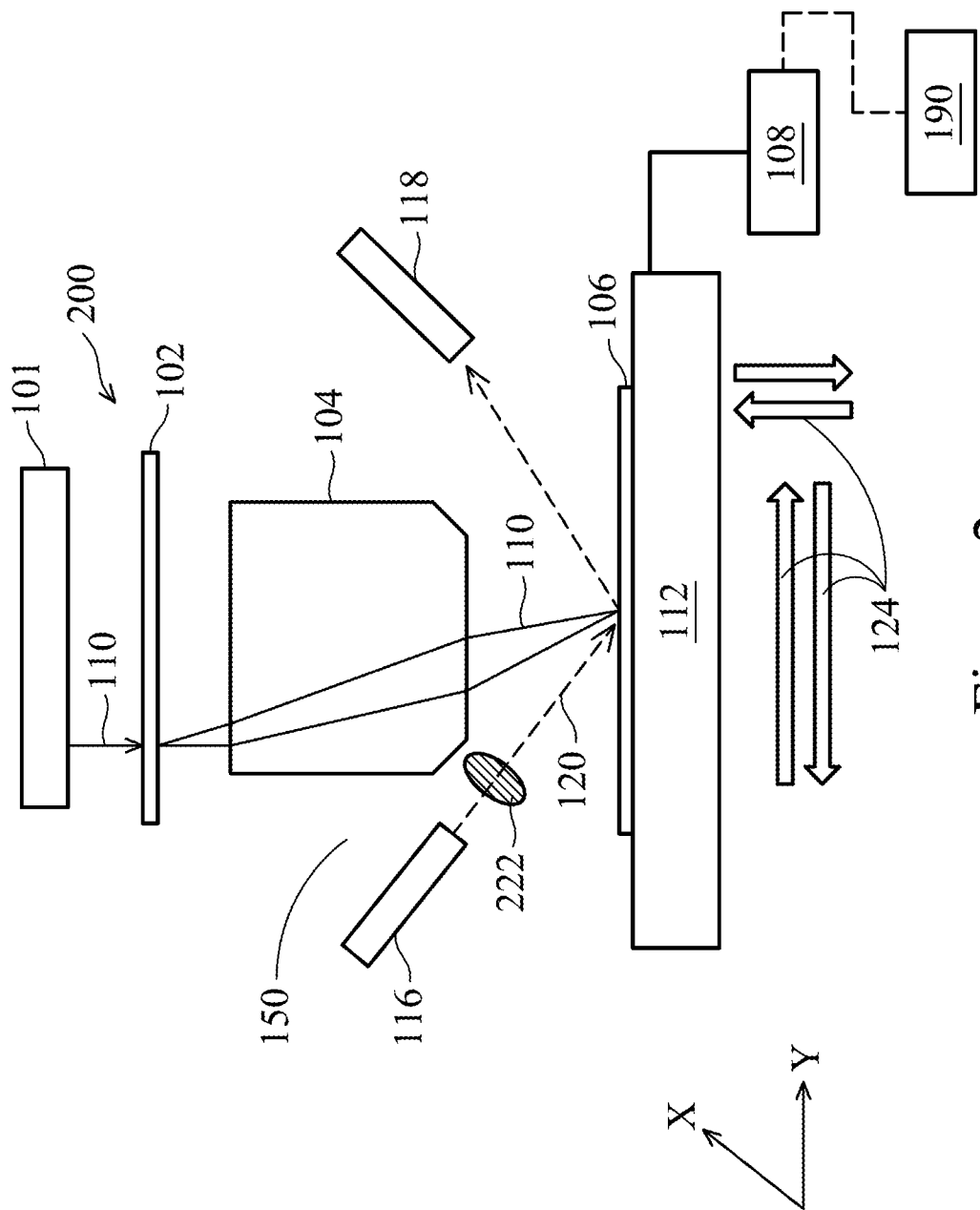
FIG. 2 depicts a schematic view of another example of a lithography projection apparatus including a substrate measuring device in accordance with some embodiments.

FIG. 2 depicts another example of a lithography projection apparatus 200, similar to the lithography projection apparatus 100 in FIG. 1, but with a polarizer 222 or a beam splitter disposed adjacent to the emitter 116. The polarizer 222 permits a portion of the beams of light 120 at certain wavelengths to be passed therethrough to the substrate 106. When a certain wavelength is desired for detection, the polarizer 222 may be utilized. The polarizer 222 is rotatable to adjust the incident angle from the beams of light 120 to allow a certain portion of the beams of light 120 with a certain wavelength or polarity to pass therethrough. Based on different types of the polarizer 222 selected, different algorithms or computational methods stored in the controller 108 and/or the data computing system 190 may be used as needed.

FIGS. 3A-3D depict a substrate profile under the measure of the substrate measuring device. The substrate measuring device includes an emitter 116*a*, 116*b*, 116*c*, 116*d* that provides different wavelengths. In some embodiments, the emitter 116*a*, 116*b*, 116*c*, 116*d* provides multiple light sources. The multiple light sources provide beams of light of different wavelengths, and the materials on the substrate have different transmittances and reflectivities in response to the different wavelengths. Thus, by utilizing the emitters 116*a*, 116*b*, 116*c*, 116*d* comprising multiple light sources with different wavelengths, a wider range of wavelength spectrum may be obtained. The wider wavelength spectrum can permit better prediction and determination of a profile of the surface on the substrate 106 and the location of the focal plane 302. When the multiple light sources are utilized, each light source may scan across the substrate to determine the profile of the substrate. The light source may scan across the substrate by moving the stage 112 where the substrate is positioned or by actuating the emitter 116*a*, 116*b*, 116*c*, 116*d* to scan across the substrate. Each emitter 116*a*, 116*b*, 116*c*, 116*d* may scan across the substrate with the same or different data collecting points on the substrate.

Figure 3A:
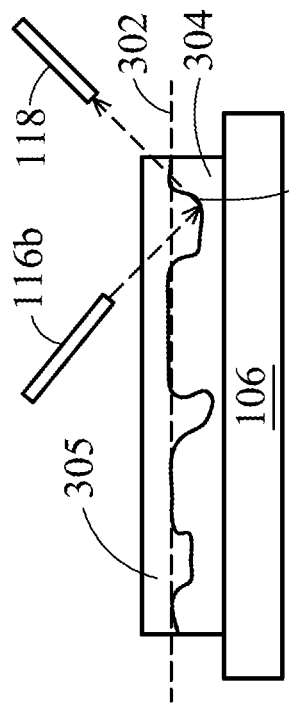
FIGS. 3A-3D depict beams of light from an emitter of a substrate measuring device incident on different locations of a substrate with different surface topographies in accordance with some embodiments.

For example, the emitter 116*a*, as depicted in FIG. 3A, provides a beam of light at a first wavelength. Material on the substrate 106 may have a given reflectivity and transmissivity in response to the first wavelength. The beam of light at the first wavelength can penetrate through a photoresist layer 305 and reflect back from a top surface 306 (e.g., an upper most) of a material layer 304 (e.g., a dielectric material or a metal material) disposed on the substrate 106. The photoresist layer 305 will be later exposed in the following lithography exposure process. Thus, the height, location, and/or the position of an upper most surface of the material layer 304 on the substrate 106 may be predicted, calculated, and/or obtained.

Figure 3B:
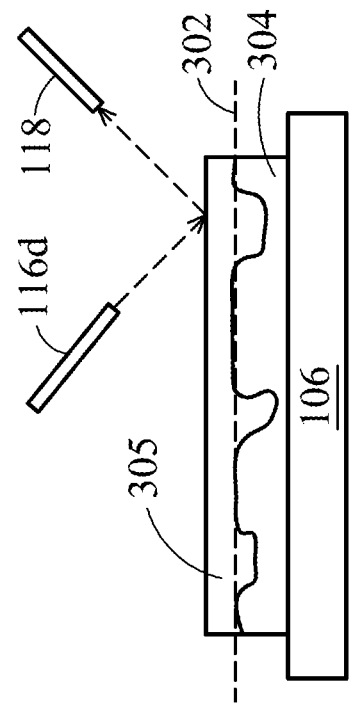
Figure 3C:
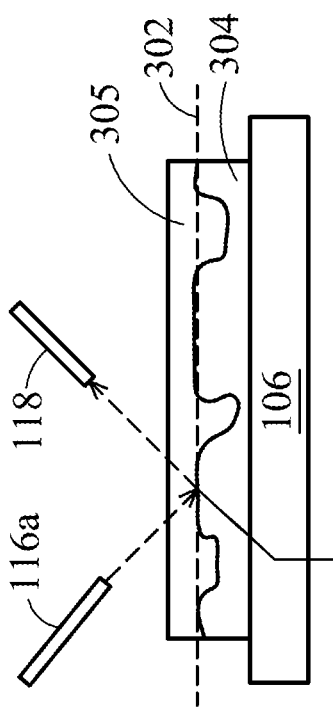
Figure 3D:
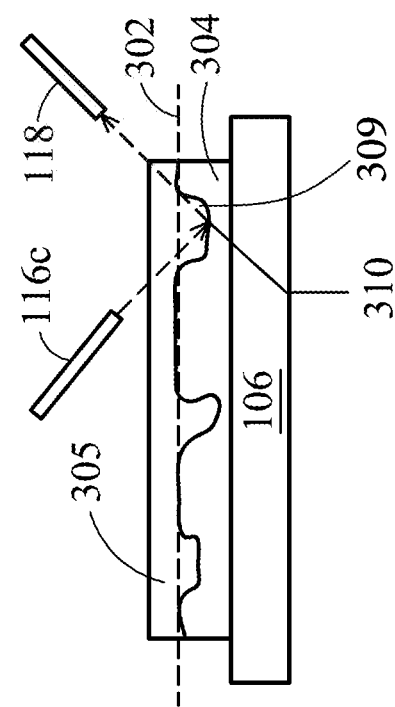

The emitter 116*b*, as depicted in FIG. 3B, provides a beam of light at a second wavelength different from the first wavelength. Based on different materials on the substrate 106, the beam of light may penetrate to a sidewall 308 (or a curved bottom corner) of the photoresist layer 305. Thus, the beam of light may be reflected from the sidewall 308 of the material layer 304 surrounded with the photoresist layer 305. The emitter 116*c*, as depicted in FIG. 3C, provides a beam of light at a third wavelength that may be able to reach to a bottom surface 310 of the indentation 309 and that may be reflected off of the bottom surface 310. The emitter 116*d*, depicted in FIG. 3D, provides a beam of light at a fourth wavelength. The photoresist layer 305 may have a relatively low transmissivity to the beam of light at the fourth wavelength such that the beam of light may be reflected once the beam of light is incident on the photoresist layer 305.

In each of FIGS. 3A-3D, the receiver 118 collects beams of light reflected from material on the substrate 106 and generates data or information based on the collected beams of light. The data or information generated by the receiver 118 is transmitted to the controller 108 and/or the data computing system 190. The data computing system 190 determines a profile/structure of the substrate 106. Thus, by collecting the data points based on light having different wavelengths, a more precise and accurate prediction of the profile, surface topography, variations of the heights, contour, and/or structures on the substrate 106 may be obtained, which may be used to define a more accurate vertical position of the substrate 106 relative to the focal plane 302. Furthermore a vertical position and/or horizontal position of the substrate may also be better determined and subsequently aligned.

FIG. 4 depicts an embodiment of an optical fiber 402 that may be implemented in the emitter 116. The optical fiber 402 includes multiple zones 404, each of which includes strands of optical fibers. The different zones 404 allow different wavelength light 410*a*, 410*b*, 410*c*, 410*d* to pass therethrough. The optical fiber 402 in FIG. 4 includes four zones 404*a*, 404*b*, 404*c*, 404*d*. In other examples, the optical fiber 402 may include more or less than four zones. Each zone 404*a*, 404*b*, 404*c*, 404*d* is capable of transmitting a different respective wavelength light 410*a*, 410*b*, 410*c*, 410*d*. A light source of the emitter 116 can provide different wavelength light 410*a*, 410*b*, 410*c*, 410*d* to different zones of the optical fiber 402 for transmission therethrough. In some examples, the light source of the emitter 116 is a broad spectrum light source having filters to filter different wavelength light 410*a*, 410*b*, 410*c*, 410*d*. In other examples, the light source of the emitter 116 includes a plurality of light sources, which each generating light at a different wavelength.

In some examples, light transmitted through the zones 404*a*, 404*b*, 404*c*, 404*d* is in a wavelength spectrum from about 100 nm to about 2000 nm. In some examples, the optical fiber 402 may have (i) a first zone 404*a* for transmitting a first wavelength light 410*a*, e.g., at a UV light range having a wavelength around 248 nm, (ii) a second zone 404*b* for transmitting a second wavelength light 410*b*, e.g., at a UV light range having a wavelength around 193 nm, and (iii) a third zone 404*c* for transmitting a third wavelength light 410*c*, e.g., at a UV light range having a wavelength around 365 nm. The optical fiber 402 may further comprise a fourth zone 404*d* for transmitting a fourth wavelength light 410*d*, e.g., at a visible light range having a wavelength of about 632 nm. It is believed that the light sources with shorter wavelength (such as UV light) can expose structures on the substrate with smaller dimensions at better resolution.

In some examples, the optical fiber 402 is micro-structured from one, two, or more materials so as to be divided into different zones 404a, 404b, 404c, 404d. The four different zones 404a, 404b, 404c, 404d may be fabricated from the same or different materials. The optical fiber 402 may be fabricated by silica, glasses, quartz, amorphous carbon, polymer materials, or other suitable materials. It is noted that different materials used in the optical fiber 402 may influence the bandgap of the beam of light transmitted therethrough. Thus, by selection of the materials of optical fiber 402 as well as the sources of the different wavelength light 410a, 410b, 410c, 410d, multiple light sources with a desired range of wavelengths and intensities can be obtained and guided to desired locations of the substrate 106. In some examples, the optical fiber 402 is fabricated from quartz or optically transmittable plastic material.

The materials of the substrate 106 through or on which the different wavelength light 410a, 410b, 410c, 410d passes or is incident, respectively, may have different transmissivity and/or reflectivity in response to the different wavelength light 410a, 410b, 410c, 410d. As each incoming substrate may have its specific type of photoresist material disposed thereon for device manufacturing requirements, the optical fiber 402 that provides different wavelength light 410a, 410b, 410c, 410d from multiple light sources may provide a wide spectrum of wavelengths to accommodate different photoresist materials (e.g., with various transmissivity and reflectivity) disposed on the substrate. As a result, a more accurate profile or contour of the surface profile on the substrate under the photoresist material may be mapped out and predicted.

FIG. 5 depicts a plurality of optical fibers 502 that may be implemented in the emitter 116. The plurality of optical fibers 502, as illustrated, includes optical fibers 504, 506, 508. Each optical fiber 504, 506, 508 is adapted to transmit light having a wavelength(s) different from others of the optical fibers 504, 506, 508. The optical fibers 504, 506, 508 may be bundled together to allow light to pass through each corresponding optical fiber 504, 506, 508 so as to guide the beams of light to a desired location on the substrate. Similar to the multiple wavelength light 410a, 410b, 410c, 410d depicted above, multiple wavelength light 510a, 510b, 510c also provide beams of light at different wavelengths to pass through the respective optical fibers 504, 506, 508. As a result, beams of light having different wavelengths are transmitted to a substrate. The different wavelength light can reach different depths of the structures on the substrate (e.g., above the photoresist material surface, above the structure on a substrate, or on a bottom of a structure on a substrate, and the like), which can provide a better prediction of the profile of the structure on the substrate. Thus, utilizing these data points as collected, a vertical and lateral relationship of the substrate to the focal plane may be more precisely determined for the following lithography exposure process with higher resolution.

In some examples, each individual optical fiber 504, 506, 508 in the plurality of optical fibers 502 may be fabricated from certain types of materials so as to maximize the efficiency and intensity of the light guided therethrough. In some examples, the optical fibers 504, 506, 508 in the plurality of optical fibers 502 may be fabricated from the same type of the materials to provide consistent and reliable light source stability.

Figure 6:
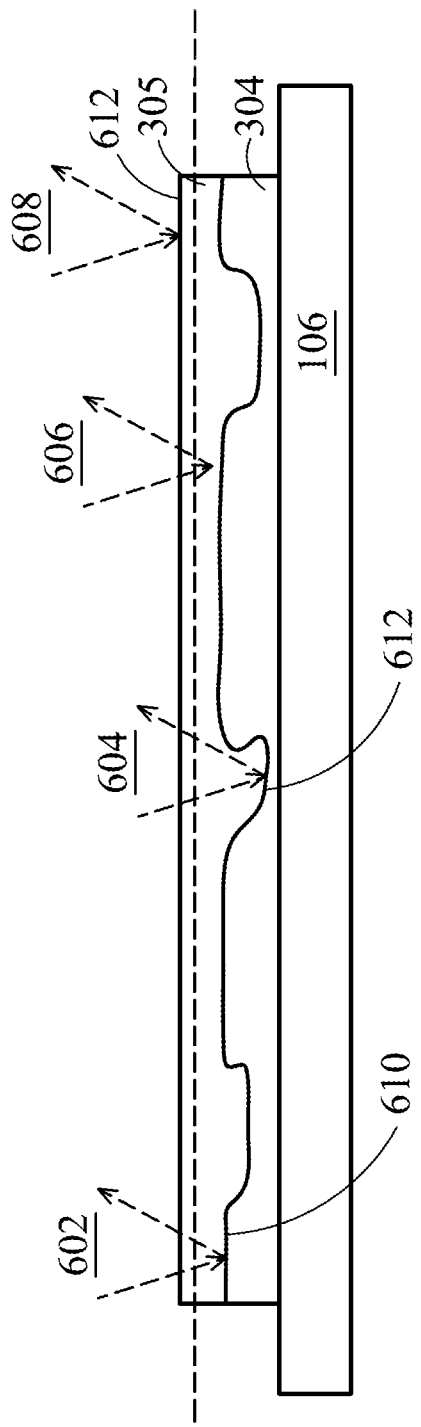
FIG. 6 depicts beams of light incident on different locations of a substrate with different surface topographies in accordance with some embodiments.

FIG. 6 depicts beams of light emitted to different locations of a substrate with different surface topographies in accordance with some embodiments. A first beam of light 602 having a first wavelength reaches to an uppermost surface 610 of the material layer 304 disposed on the substrate 106. A second beam of light 604 having a second wavelength reaches to a lower surface 612 of the material layer 304 disposed on the substrate 106. A third beam of light 606 having a third wavelength emits to the photoresist layer 305 disposed on the material layer 304 so as to predict a thickness of the photoresist layer 305. It is noted that the third beam of light 606 may be stopped at any depth in the photoresist layer 305 for thickness or profile prediction based on its wavelength. A fourth beam of light 608 having a fourth wavelength reflects from a top surface 612 of the photoresist layer 305 so that the leveling and height of the photoresist layer 305 may be detected and determined. Thus, by collecting and analyzing the information from the reflected beams of light by the receiver 118, the surface profile, as well as the thickness, leveling, and height of the photoresist layer 305, across the substrate 106 may be mapped, calculated, and/or determined so as to better position the substrate relative to a focal plane.

It is noted that, although four beams of light are shown in FIG. 6, any number of beams of light having different wavelengths may be used to assist measuring and mapping the substrate profile for better alignment of the substrate.

FIGS. 7A-7D depict different examples of emitters 702, 704, 706, 708 in accordance with some embodiments. The emitters 702, 704, 706, 708 include an outer cast 712, 714, 716, 718 enclosing a plurality of optical fibers 722, 724, 726, 728, respectively. Similar to the configurations depicted in FIGS. 4 and 5, the plurality of optical fibers 722, 724, 726, 728 enclosed by the outer cast 712, 714, 716, 718 may include multiple materials or a single material to provide a waveguide to guide the light having different wavelengths to the desired locations on the substrate. The outer cast 712, 714, 716, 718 may be in any shape or configuration, such as shown in FIGS. 7A-7D.

Figure 7A:
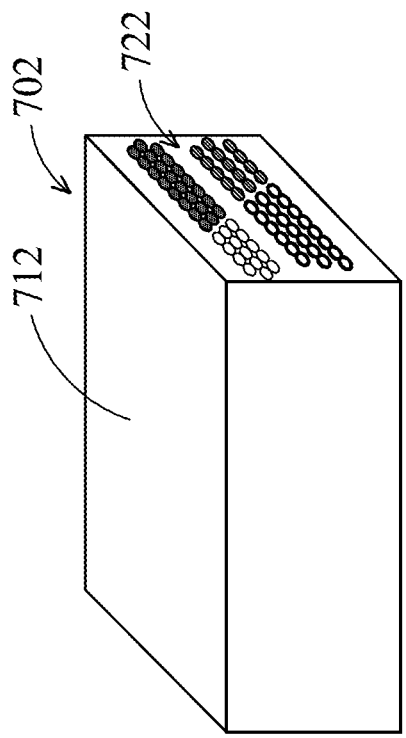
FIGS. 7A-7D depict emitters with different fibers and configurations of shields formed therein in accordance with some embodiments.
Figure 7B:
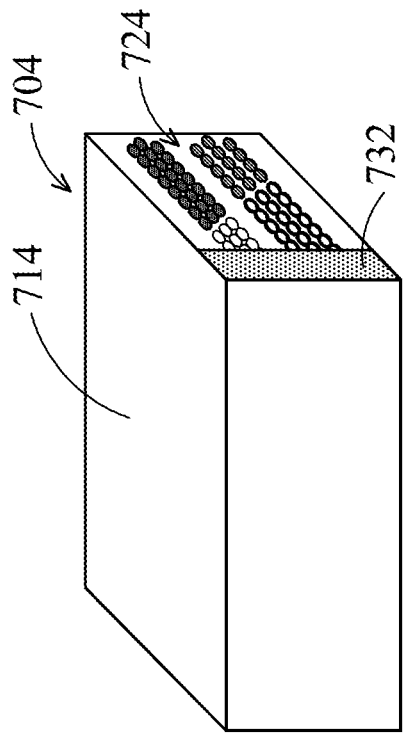

FIG. 7B depicts another example of the emitter 704 that has a shield 732. The shield 732 shields light paths of the light travelling through a portion of the plurality of optical fibers 724. The shield 732 may shield the light paths passing through a portion of the optical fibers 724 in the outer cast 714, which can block some beams of light at certain wavelengths from reaching the substrate 106. In some embodiments wherein certain locations of the substrate may need to be inspected or detected, the shield 732 can be utilized to block the light paths from a portion of the optical fibers 724, which can allow desired beams of light at certain wavelengths to be emitted to the substrate surface. By doing so, beams of light at certain wavelengths may be selected based on different materials or device properties of the incoming substrate so that process parameters may be better determined.

Figure 7C:
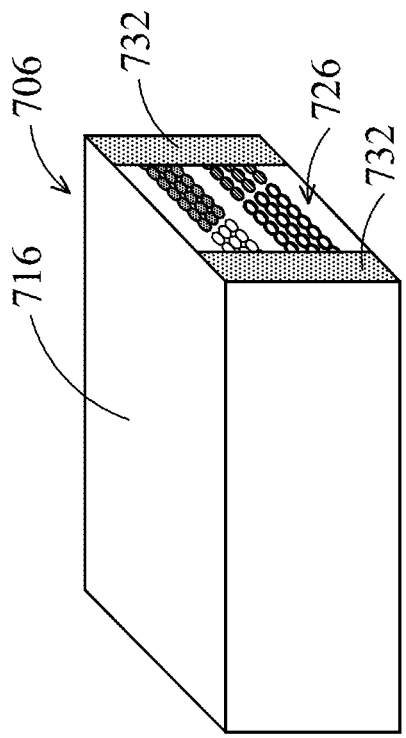
Figure 7D:
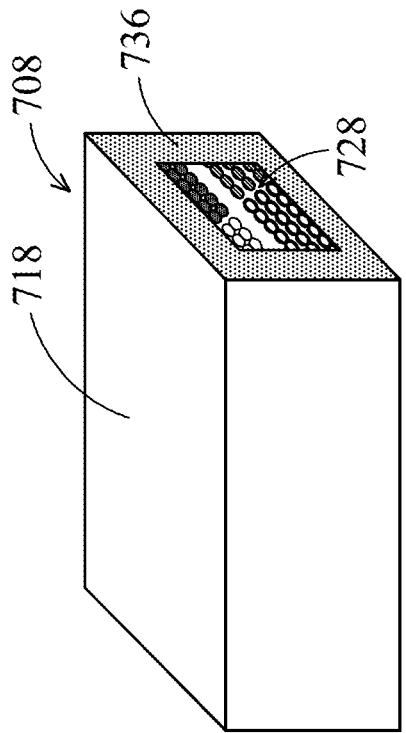

In some embodiments, the shield 732 may be a metal plate that has high reflectivity and low transmittance to efficiently block the light paths of the beams of light transmitted through the optical fibers 724. The shield 732 may be located in any suitable location in the emitter 704. In some embodiments, the shield 732 has a rectangular shape covering one side, as shown in FIG. 7B, or multiple sides, as shown in FIG. 7C, in horizontal and/or vertical directions where the optical fibers 724 are located. In some embodiments, the shield 736 may serve as a frame covering an outer perimeter of the optical fibers 728 having a center opening exposing the optical fibers 728 located in the center of the emitter 708, as shown in FIG. 7D.

Figure 8:
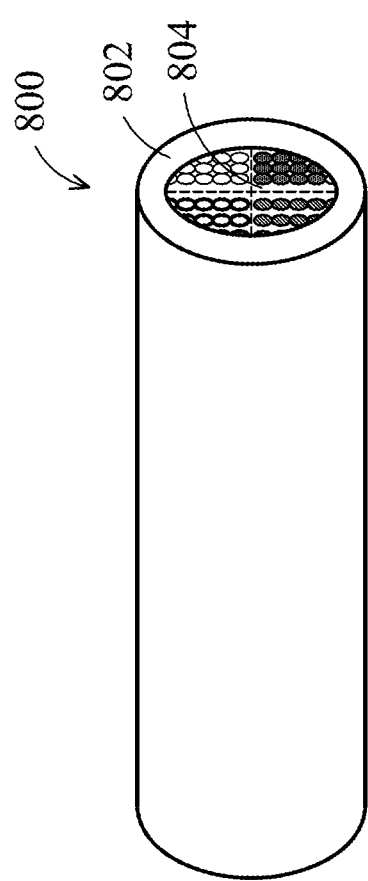
FIG. 8 depicts an emitter with a shield and different fibers formed therein in accordance with some embodiments.

FIG. 8 depicts another embodiment wherein the emitter 800 is in a cylindrical configuration. A shield 802 may be in a ring shape that covers an outer portion of the optical fibers 804, and that exposes a center portion of the optical fibers 804 by a center opening through the shield 802. It is noted that the shield 802, 732, 736 may be in any configuration to accommodate the shapes, configurations, and designs of the emitters utilized to perform the substrate mapping process.

Figure 9:
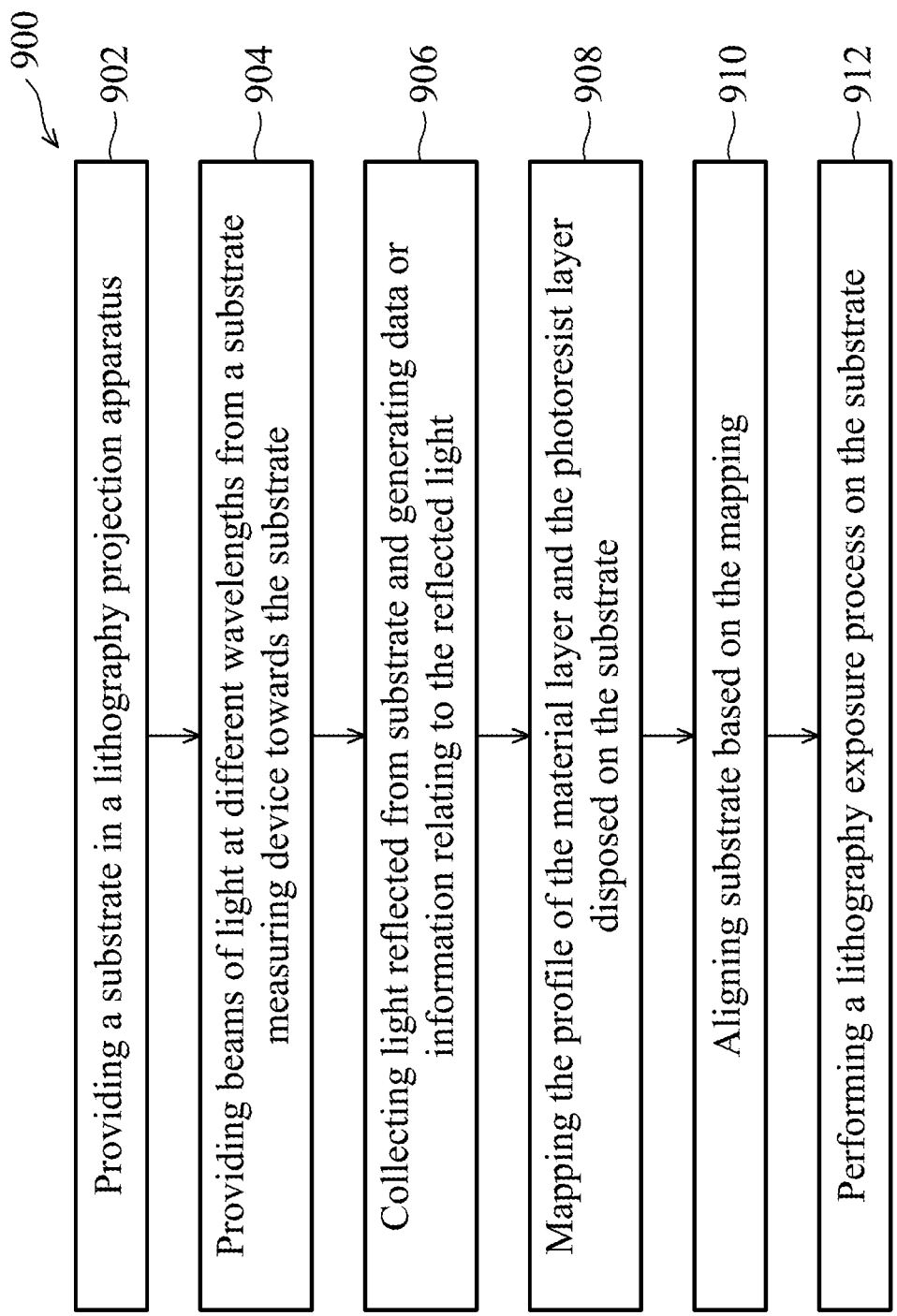
FIG. 9 depicts a flow chart of performing a substrate alignment process in accordance with some embodiments.

FIG. 9 depicts an exemplary flow diagram of a substrate alignment process 900 that utilizes the substrate measuring devices described above. The substrate alignment process 900 begins at operation 902 by providing a substrate, such as the substrate 106, on a stage in a lithography projection apparatus, such as the lithography projection apparatus 100 depicted in FIG. 1. The lithography projection apparatus 100 includes the substrate measuring device 150 (with the emitter 116 and receiver 118) disposed therein to be implemented for predicting and mapping the profile and structures on the substrate. It is noted that the lithography projection apparatus 100 may include more than one stage to separately perform the substrate alignment process and the lithography exposure process on the substrate.

As discussed above, the substrate includes a photoresist material disposed on a material layer. The material layer may include structures, multiple layers, a stack of film layers, or other suitable materials for manufacturing a device structure. The photoresist material is disposed on the material layer for exposure after the alignment process.

At operation 904, after the substrate is placed on the stage disposed in the lithography projection apparatus, multiple wavelength lights are provided from the emitters of the substrate measuring device. As discussed above, the emitters provide multiple wavelength light sources that emit beams of light having different wavelengths to the substrate. The beams of light with different wavelengths may be emitted to a plurality of locations of the substrate. Different materials on the substrate can have various transmissivities and reflectivities to the light with different wavelengths, and hence, can have different responses to the light with different wavelengths when the light is incident on and/or passes through the materials. In some embodiment, the substrate often includes physical references (e.g., or called alignment marks) located at least two opposite sides of the substrate surface to allow the emitter to aim at so as to measure their vertical and/or horizontal positions relative to the substrate surface.

At operation 906, light reflected from the substrate is collected at the receiver of the substrate measuring device, and the receiver generates data or information related to the reflected light. The substrate measuring device may be moved vertically, horizontally, and/or diagonally relative to an X-Y plane of the substrate for facilitating the collecting of light reflected from the substrate. The substrate measuring device may also be rotated at an angle to detect if the substrate is tilted. The substrate disposed on the stage may be moved or translated at certain directions relative to the substrate measuring device so as to scan the surface across the substrate.

At operation 908, after the light reflected from the substrate is collected by the receiver and the data or information is generated, the data points generated by the receiver are then analyzed to map out the profile, height, and/or contour, or optionally, to determine the thickness of the photoresist layer on the substrate. Since the beams of light with different wavelengths can reach to different depths of the photoresist material as well as the material layer disposed on the substrate, variations in substrate height can be measured and obtained so that a more accurate profile of the substrate surface is determined. Based on the determined substrate height map, a vertical position of an X-Y plane of the substrate relative to the focal plane may be determined to better level the vertical position of the substrate. As a result, the position of the X-Y plane of the substrate relative to the focal plane of the projection of the optical focusing module 104 is determined with higher accuracy and image resolution.

At operation 910, after the substrate profile is mapped and a vertical position relative to the focal plane is determined, the substrate is aligned for the lithography exposure process based on the mapping. The stage and translation mechanism can be moved under the control of the controller to align the substrate based on the mapping.

At operation 912, the lithography exposure process is performed on the substrate. The light radiation from the radiation source 101 is passed through the photomask reticle 102 and focused on the focal plane by the assistance from the optical focusing module 104. Thus, the mask pattern from the photomask reticle 102 is projected and exposed on the photoresist material disposed on the substrate.

Embodiments described herein provide a substrate measuring device in a lithography projection apparatus that includes an emitter that provides multiple light sources having different wavelengths. The substrate measuring device with multiple light sources can be used to provide a better alignment of the substrate during a lithography exposure process. The multiple light sources may provide beams of light at different wavelengths to be emitted to a substrate surface. The beams of light with different wavelengths may provide a wide spectrum of wavelengths, and the materials on the substrate can have different transmissivity and reflectivity based on the different wavelengths so that the variations of the height of the structures formed on the surface of the substrate can be detected and mapped. In some examples, the emitter utilizes optical fibers to guide the beams of light from the multiple light sources to the desired locations on the substrate. The optical fibers may include multiple zones to guide the beams of light with different wavelengths. The multiple zones in the optical fiber may be fabricated from different or the same materials. The emitter may include a plurality of optical fibers and some of the optical fibers may be fabricated from the same or different materials to guide beams of light with different wavelengths.

In an embodiment, a lithography projection apparatus includes a substrate measuring system disposed proximate to a substrate stage, the substrate measuring system further including an emitter including multiple light sources configured to provide multiple beams of light, each of at least some of the multiple beams of light having a different wavelength, at least one optical fiber, wherein each of respective portions of the at least one optical fiber is configured to pass a respective one of the multiple beams of light, and a receiver positioned to collected light emitted from the emitter and reflected off of a substrate disposed on the substrate stage.

In another embodiment, a method for semiconductor processing, the method includes providing beams of light from an emitter to a substrate, wherein the beams of light have multiple wavelengths, collecting reflected light of the beams of light at a receiver, the reflected light being reflected off of the substrate, determining a variation of height of the substrate based on the collected reflected light, and aligning the substrate with an optical focusing module in response to the detected variation of height of the substrate.

In yet another embodiment, a method for semiconductor processing, the method includes emitting multiple beams of light from multiple light sources from an emitter to a substrate, wherein the multiple beams of light have different wavelengths, collecting reflected light of the multiple beams of light at a receiver, the reflected light being reflected off of the substrate, mapping variations of height across the substrate based on the collected reflected light, determining a leveling position of the substrate relative to a focus plane based on the mapping, aligning the substrate at the leveling position, and performing a lithography exposure process on the substrate after aligning the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for semiconductor processing, the method comprising:
   providing beams of light from an emitter, wherein the beams of light have multiple wavelengths;
   passing the beams of light have multiple wavelengths through a polarizer;
   providing the beams of light that have passed through the polarizer to a substrate via at least one optical fiber including multiple zones, each of the multiple zones including strands of optical fibers, a material of the strands of optical fibers of a zone being different from the material of the strands of optical fibers of a different zone, the substrate include materials having different transmittance with respect to the beams of light having the multiple wavelengths;
   collecting reflected light of the beams of light at a receiver, the reflected light being reflected off of the substrate;
   determining a variation of height of the substrate based on the collected reflected light; and
   aligning the substrate with an optical focusing module in response to the determined variation of height of the substrate.

2. The method of claim 1, wherein the emitter comprises multiple light sources to provide the beams of light having the multiple wavelengths.

3. The method of claim 1, wherein the multiple wavelengths are in a range from 10 nm to 2000 nm.

4. The method of claim 1, wherein the substrate comprises a photoresist layer disposed on a material layer.

5. The method of claim 1, wherein providing the beams of light further comprises:
   directing the beams of light to an alignment mark on the substrate.

6. The method of claim 1, wherein determining variation of height of the substrate further comprises:
   determining a vertical position of the substrate relative to a focal plane defined by an optical focusing module in a lithography projection apparatus.

7. The method of claim 6, further comprising:
   performing a lithography exposure process in the lithography projection apparatus after aligning the substrate with the optical focusing module.

8. The method of claim 6, wherein the emitter and the receiver are disposed in the lithography projection apparatus.

9. The method of claim 1, wherein the beams of light pass through at least one optical fiber disposed in the emitter.

10. The method of claim 1, wherein the providing beams of light having the multiple wavelengths from the emitter including meeting serially from the emitter, light with a single wavelength or narrow wavelength spectrum.

11. A method for semiconductor processing, the method comprising:
    providing light at multiple wavelengths from a broad spectrum light source of an emitter;
    filtering the light at multiple wavelengths to produce multiple beams of light, each of at least some of the multiple beams of light having a different wavelength;
    passing the multiple beams of light through a polarizer;
    transmitting the multiple beams of light that have passed through the polarizer to a substrate, wherein the multiple beams of light are provided to the substrate via at least one optical fiber including multiple zones, each of the multiple zones including strands of optical fibers, a material of the strands of optical fibers of a zone being different from the material of the strands of optical fibers of a different zone;
    shielding the substrate from a portion of the multiple beams of light utilizing a metal shield on the emitter;
    collecting reflected light of the multiple beams of light at a receiver, the reflected light being reflected off of the substrate;
    mapping variations of height across the substrate based on the collected reflected light;
    determining a leveling position of the substrate relative to a focus plane based on the mapping;
    aligning the substrate at the leveling position; and
    performing a lithography exposure process on the substrate after aligning the substrate.

12. The method of claim 11, wherein the shield is ring shaped and includes a center opening, a portion of the shield configured to block a portion of the multiple beams of light and to allow a portion of the multiple beams of light to pass through the center opening.

13. The method of claim 11, wherein the shield serves as a frame covering an outer perimeter of the emitter and exposing a portion of the emitter through a center opening.

14. The method of claim 11, wherein the multiple beams of light include UV light or visible light.

15. The method of claim 11, wherein the different wavelengths are in a range from 10 nm to 2000 nm.

16. A method for semiconductor processing, the method comprising:
    emitting multiple beams of light from multiple light sources from an emitter to a substrate, wherein the multiple beams of light have different wavelengths;
    transmitting the multiple beams of light from the emitter to a substrate, wherein the multiple beams of light are provided to the substrate via at least one optical fiber including multiple zones, each of the multiple zones including strands of optical fibers, a material of the strands of optical fibers of a zone being different from the material of the strands of optical fibers of a different zone;

collecting reflected light of the multiple beams of light at a receiver, the reflected light being reflected off of the substrate;

determining a variation of height of the substrate based on the collected reflected light; and aligning the substrate with an optical focusing module in response to the determined variation of height of the substrate.

17. The method of claim 16, wherein the multiple beams of light include UV light or visible light.

18. The method of claim 16, further comprising shielding the substrate from a portion of the multiple beams of light utilizing a shield on the emitter.

19. The method of claim 18, wherein the shield is a metal shield.

20. The method of claim 16 further comprising, polarizing at least one of the multiple beams of light.

* * * * *